United States Patent
Ohshima et al.

[19]

[11] Patent Number: 6,163,501
[45] Date of Patent: Dec. 19, 2000

[54] SYNCHRONOUS SEMICONDUCTOR MEMORY DEVICE

[75] Inventors: Shigeo Ohshima; Susumu Ozawa, both of Kawasaki, Japan

[73] Assignee: Kabushiki Kaisha Toshiba, Kawasaki, Japan

[21] Appl. No.: 09/520,720

[22] Filed: Mar. 8, 2000

[30] Foreign Application Priority Data

Mar. 8, 1999 [JP] Japan .................................. 11-060440

[51] Int. Cl.[7] ........................................................ G11C 8/00
[52] U.S. Cl. ...................... 365/233; 365/189.05; 365/220
[58] Field of Search .............................. 365/233, 189.05, 365/220, 239

[56] References Cited

U.S. PATENT DOCUMENTS

| | | |
|---|---|---|
| 5,469,558 | 11/1995 | Lieberman et al. . |
| 5,784,705 | 7/1998 | Leung . |
| 5,835,443 | 11/1998 | Fujita . |
| 5,901,109 | 5/1999 | Miura ....................................... 365/233 |
| 6,011,748 | 1/2000 | Lepejian et al. .......................... 365/239 |

FOREIGN PATENT DOCUMENTS

| | | |
|---|---|---|
| 0768670A2 | 4/1997 | European Pat. Off. . |
| 2907074 | 4/1999 | Japan . |

OTHER PUBLICATIONS

H. Yoo, "A Study of Pipeline Architectures for High–Speed Synchronous Dram's", IEEE Journal of Solid State Circuits, vol. 32, No. 10, pp. 1597–1603, (1997).

*Primary Examiner*—Huan Hoang
*Attorney, Agent, or Firm*—Finnegan, Henderson, Farabow, Garrett, & Dunner L.L.P.

[57] ABSTRACT

A synchronous semiconductor memory device comprises: a memory cell array; a decoder circuit for decoding an address, which is supplied in synchronism with a clock, to select a memory cell of the memory cell array; a plurality of main data line pairs, to which data of the memory cell array are transferred; a plurality of data line buffers, each of which is provided in a corresponding one of the main data line pairs and each of which includes a latch circuit; and a plurality of peripheral data lines for transferring data of each of the data line buffers to a data input/output terminal, wherein a plurality of bits of data per data input/output terminal read out of the memory cell array are transferred to the data line buffers via the main data line pairs in parallel, and while head data of the plurality of bits of data pass through the latch circuits to be transferred to one of the peripheral data lines, a plurality of continuous data are temporarily held by the latch circuit, and subsequent data are sequentially transferred to the same peripheral data line as the one of the peripheral data lines, to which the head data have been transferred. Thus, it is possible to decrease the number of peripheral data lines to reduce the chip size of an SDRAM while adopting a pre-fetch system for accelerating a data transfer cycle.

21 Claims, 7 Drawing Sheets

SYNCHRONOUS SEMICONDUCTOR MEMORY DEVICE

CROSS REFERENCE TO RELATED APPLICATIONS

The subject application is related to subject matter disclosed in Japanese Patent Application No. Hei 11-60440 filed on Mar. 8, 1999, in Japan to which the subject application claims priority under the Paris Convention and which is incorporated herein by reference.

BACKGROUND OF THE INVENTION

1. Field of The Invention

The present invention relates generally to a synchronous semiconductor memory device wherein a data transfer is carried out in synchronism with a clock. More specifically, the invention relates to an internal data transfer system in a DDR synchronous DRAM and so on wherein a pre-fetch system for a plurality of bits of data is used.

2. Related Background Art

Conventionally, in order to realize a rapid data access and high data band width in DRAMS, synchronous DRAMs (SDRAMs) are proposed. The SDRAMs are practicable from 4-Mbit DRAMS, and account for most of the current 64-Mbit DRAMs. The SDRAMs are characterized in that a rapid access time and cycle time are realized by utilizing a clock synchronization. Recently, it is requested to further accelerate the SDRAMs.

The operating speed of an SDRAM is determined by a series of data transfer operations for transferring data, which are read out to bit lines of a memory cell array, to a main data line via a column selecting gate to amplify the transferred data to transfer the amplified data to an input/output terminal via a peripheral data line. There is a limit to the accelerating of the data transfer operations. Therefore, as a technique for apparently improving a data transfer speed, there is a system for dividing a column access path into 2, 3 or 4 pipeline stages in accordance with the number of CAS latencies to carry out the overlap operation of these pipeline stages. In addition, a plurality of bits of data per I/O terminal are simultaneously read from the memory cell array to be parallel-to-serial converted by a peripheral circuit to be fetched. This technique is called a data pre-fetch, which will be hereinafter referred to as a 2-bit pre-fetch when 2-bit data per I/O terminal are simultaneously read out, and as a 4-bit pre-fetch when 4-bit data per I/O terminal are simultaneously read out.

In the case of the 2-bit pre-fetch, 2-bit data parallel-transferred to a data line via a column selecting line are amplified by data line buffers, respectively, to be transferred to separate peripheral data lines. The order in which the 2-bit data parallel-transferred to the peripheral data lines are fetched is determined in accordance with the least significant column address A0, so that the 2-bit data are parallel-to-serial converted to be fetched.

At present, the main current of the clock frequencies of SDRAMs is in the range of from 100 MHz to 133 MHz. If the above described data pre-fetch system is adopted by a technique for carrying out a column selection in a clock cycle to synchronize output data with both of leading and trailing edges of a clock or synchronize output data with an intersecting time between a clock CLK and a complementary clock /CLK thereto, it is possible to realize a data transfer speed of 200 MHz to 266 MHz twice as large as the clock frequency (DDR SDRAM).

However, there is always a limit to the chip size in DRAMs. In particular, when a pre-fetch system is adopted, there is a problem in that a peripheral wiring region is pressed. For example, in the 2-bit pre-fetch, the number of peripheral data lines is twice as large as that when any pre-fetch systems are adopted. In the case of an SDRAM for reading data to 16 input/output terminals in parallel, the number of required peripheral data lines is 32, and in the case of 32-bit parallel readout, the number of required peripheral data lines is 64.

If the capacity of a memory is further increased like a 256-Mbit memory, the rate of the area occupied by a memory cell array increases, so that the influence of the increased number of peripheral data lines is relatively decreased. However, in a memory capacity of 64 Mbits or 128 Mbits, the area occupied by the peripheral data lines can not be ignored, so that there is a default-like overhead with respect to a conventional DRAM which does not adopt the pre-fetch system.

SUMMARY OF THE INVENTION

It is therefore an object of the present invention, in DDR SDRAM and so on, to eliminate the aforementioned problems and to provide a synchronous semiconductor memory device capable of reducing the number of peripheral data lines to reduce a chip size while adopting a pre-fetch system for accelerating a data transfer cycle.

In order to accomplish the aforementioned and other objects, according to one aspect of the present invention, a synchronous semiconductor memory device comprising: a memory cell array; a decoder circuit for decoding an address which is supplied in synchronism with a clock, to select a memory cell of said memory cell array; a plurality of main data line pairs to which data of said memory cell array are transferred; a plurality of data line buffers each of which is provided in a corresponding one of said main data line pairs and each of which includes a latch circuit; and a plurality of peripheral data lines for transferring data of each of said data line buffers to a data input/output terminal, wherein a plurality of bits of data per data input/output terminal read out in parallel from said memory cell array, as a pre-fetch read out operation, are transferred to said data line buffers via said main data line pairs in parallel during one cycle of said clock, control signals each corresponding to each of plurality of bit of data are generated based on specific one or more bits of said address, said control signals are applied to said data line buffers, and while head data of said plurality of bits of data transfer from said latch circuits to one of said peripheral data lines, a plurality of continuous data are temporarily held in said latch circuits, and subsequent data are sequentially transferred by said control signals to the same peripheral data line as said one of said peripheral data lines, to which the head data have been transferred.

According to another aspect of the present invention, a synchronous semiconductor memory device comprising: a memory cell array including a plurality of bit lines and a plurality of word lines provided so as to intersect said plurality of bit lines, and a plurality of dynamic memory cells each of which being arranged at a corresponding one of the intersections between said plurality of word lines and said plurality of word lines; a decoder circuit for decoding an address which is supplied in synchronism with a clock, to select one of said bit lines and one of said word lines of said memory cell array; a plurality of main data line pairs, to which pairs a plurality of bits of data per data input/output terminals, being selected and transferred in parallel from said memory cell array by said decoder circuit; a plurality of data line buffers each of which is provided in a corresponding one of said main data line pairs, each of said plurality of data line buffers being timing-controlled so as to sense said plurality of bits of data, which data being transferred in parallel in one cycle of said clock, to output the sensed data in a time shearing operation in serial by adding control signals to said data line buffer, each of said control signals corresponding to each of plurality of bits of data, which control signals being generated based on specific one or more bits of said address; and a plurality of peripheral data lines for serially transferring a plurality of bits of data, which are outputted in serial from said data line buffers in the time shearing operation, to a common data input/output terminal.

According to another aspect of the present invention, a synchronous semiconductor memory device comprising: a memory core capable of pre-fetching a plurality of bits of data selected by an address; a plurality of main data lines each of which outputs 1-bit data of said plurality of bits of data from said memory core; a plurality of latches each of which is connected to a corresponding one of said main data lines; and a peripheral data line which is connected to an output side of each of said plurality of latches and connected to an I/O terminal, wherein said plurality of latches are arranged to sequentially output said plurality of bits of data in one cycle of clock to said peripheral data line based on specific one or more bits of said column address.

According to a further aspect of the present invention, there is provided a data transfer method in a synchronous semiconductor memory device, said method comprising the steps of: giving an address to a memory core to pre-fetch a plurality of bits of data; storing each of the pre-fetched plurality of bits of data in each of latches; and sequentially opening each of said latches by each of control signals, each of said control signals corresponding each of specific bits of column address to serially output 1-bit data in one cycle of clock from each of said latches to a peripheral data line.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1:
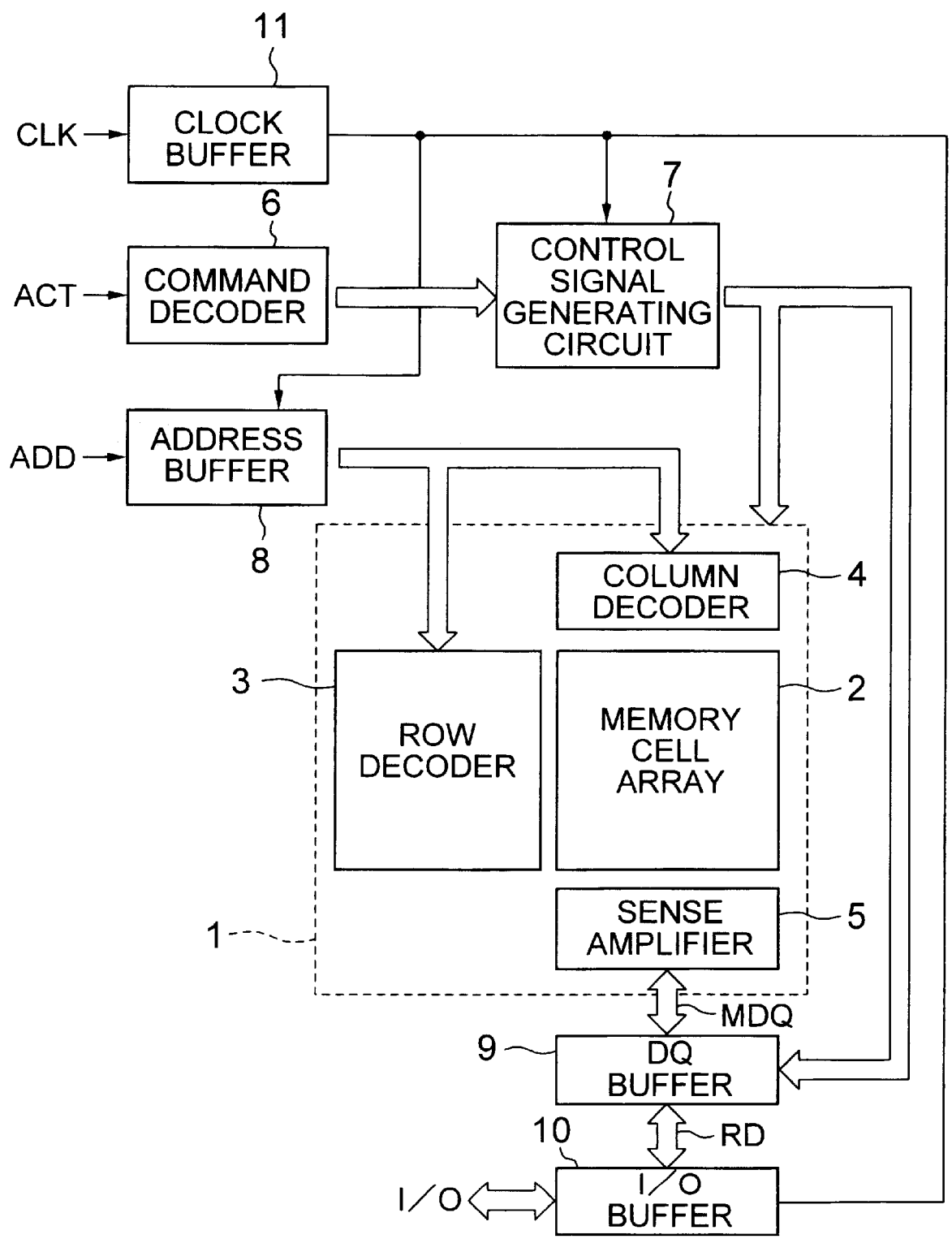
FIG. 1 is a block diagram of a preferred embodiment of an SDRAM according to the present invention.

FIG. 1 is a block diagram of a preferred embodiment of a DDR SDRAM according to the present invention. In the embodiment of FIG. 1, not one bit data, but two bits data are output from the SDRAM during one clock cycle. A DRAM core 1 includes a memory cell array 2, a row decoder 3 and column decoder 4 for selecting a word line and bit line of the memory cell array 2, and a bit line sense amplifier 5 for amplifying bit line data.

An external clock CLK is incorporated by a clock buffer 11 to produce an internal clock. A command decoder 6 decodes a command ACT for indicating the readout/writing of data from the outside. On the basis of the resulting decode signal and the internal clock, a control signal generating circuit 7 generates various control signals, such as a sense amplifier activating signal which is timing-controlled by the internal clock. An address buffer 8 incorporates an address ADD in synchronism with the internal clock to transmit a row address and a column address to the row decoder 3 and the column decoder 4, respectively. The data read out of the DRAM core 1 to be transferred to a main data line MDQ are amplified by a data line buffer 9. The data amplified by the data line buffer 9 are transferred to a peripheral data line RD to be fetched to an I/O terminal via an I/O buffer 10 which is controlled by the internal clock.

Figure 2:
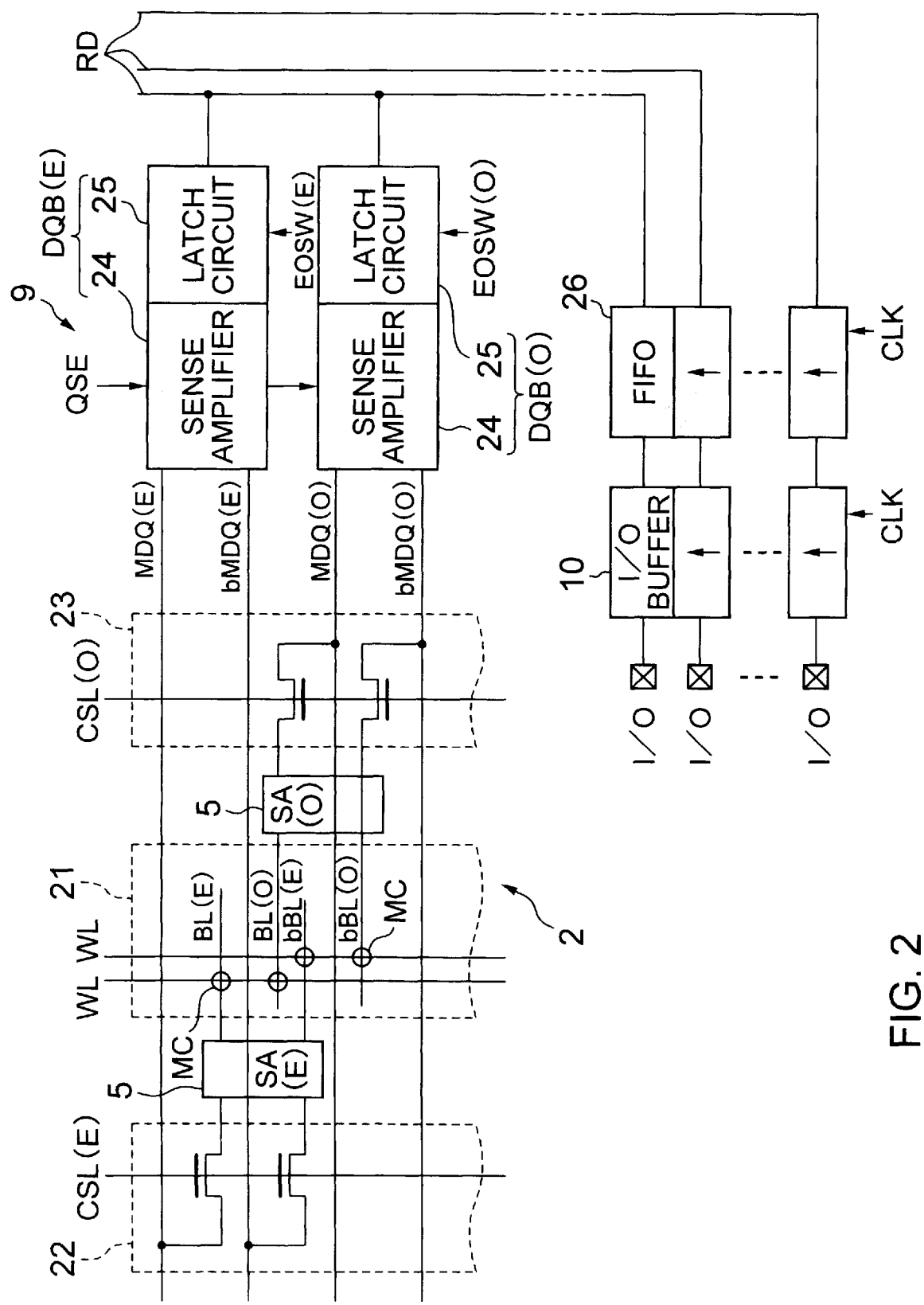
FIGS. 2 and 2A are circuit diagrams each showing a principal part of a data transfer path from a DRAM core to an input/output terminal in the preferred embodiments.

FIG. 2 shows the construction of a principal part relating to the data transfer from the DRAM core 1 to the I/O terminal by taking notice of one peripheral data line RD when a 2-bit pre-fetch system is adopted. When the number of I/O terminals is 16, the number of peripheral data lines RD is also 16 in the case of a solid wire. FIG. 2 shows one cell block 21 of the memory cell array 2 usually comprising a plurality of cell blocks. As shown in this figure, in the cell block 21, a plurality of word lines WL and a plurality of bit line pairs BL and bBL intersecting the work lines WL are formed, and dynamic memory cells MC are arranged at the intersections therebetween.

In the region of the memory cell array 2, a plurality of main data line pairs MDQ and bMDQ are provided. Of the main data line pairs, two pairs of main data lines MDQ(E), bMDQ(E) and MDQ(O), bMDQ(O) corresponding to 2-bit data read out in parallel are shown in FIG. 2. For example, the pair of MDQ(E) and bMDQ(E) corresponds to head data selected at the least significant column address CA0=0, and the pair of MDQ(O) and bMDQ(O) corresponds to subsequent data selected at CA0=1. These two pairs of main data lines hold one peripheral data line RD in common.

The bit line data of the cell block 21 are amplified by the bit line sense amplifier 5 to be transferred to the main bit line pair MDQ, bMDQ via column selecting gates 22, 23 driven by a column selection signal CSL. The end portions of the main data line pair MDQ, bMDQ are provided with data line buffers DQB(E), DQB(O) contained in the data line buffer 9 of FIG. 1, respectively.

In this preferred embodiment, two column selecting lines CSL(E), CSL(O) shown as an example are simultaneously selected in synchronism with a clock, so that 2-bit bit line data are simultaneously transferred to the main data line pairs MDQ(E), bMDQ(E) and MDQ(O), bMDQ(O) to be amplified by the data line buffers DQB(E) and DQB(O). That is, although the 2-bit pre-fetch operation is carried out, the 2-bit data are transferred to one peripheral data line RD in a time sharing operation unlike the conventional system. For that reason, each of the data line buffers DQB comprises a sense amplifier 24, and a latch circuit 25 serving as a cache for temporarily holding data which are amplified by the sense amplifier 24.

Figure 7:
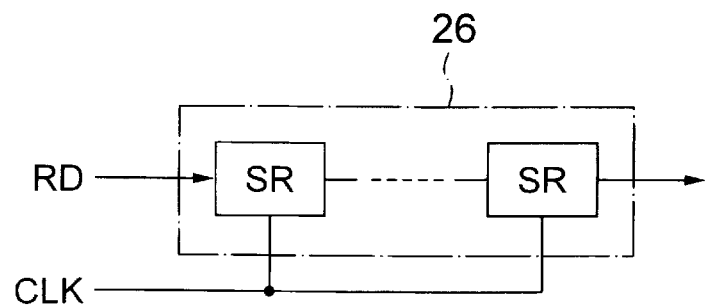
FIG. 7 is a diagram showing a FIFO buffer.

The data transferred to the peripheral data line RD are fetched to the I/O terminal via a FIFO buffer 26 and the I/o buffer 10. The FIFO buffer 26 may be a well known FIFO buffer shown in FIG. 7.

Figure 3:
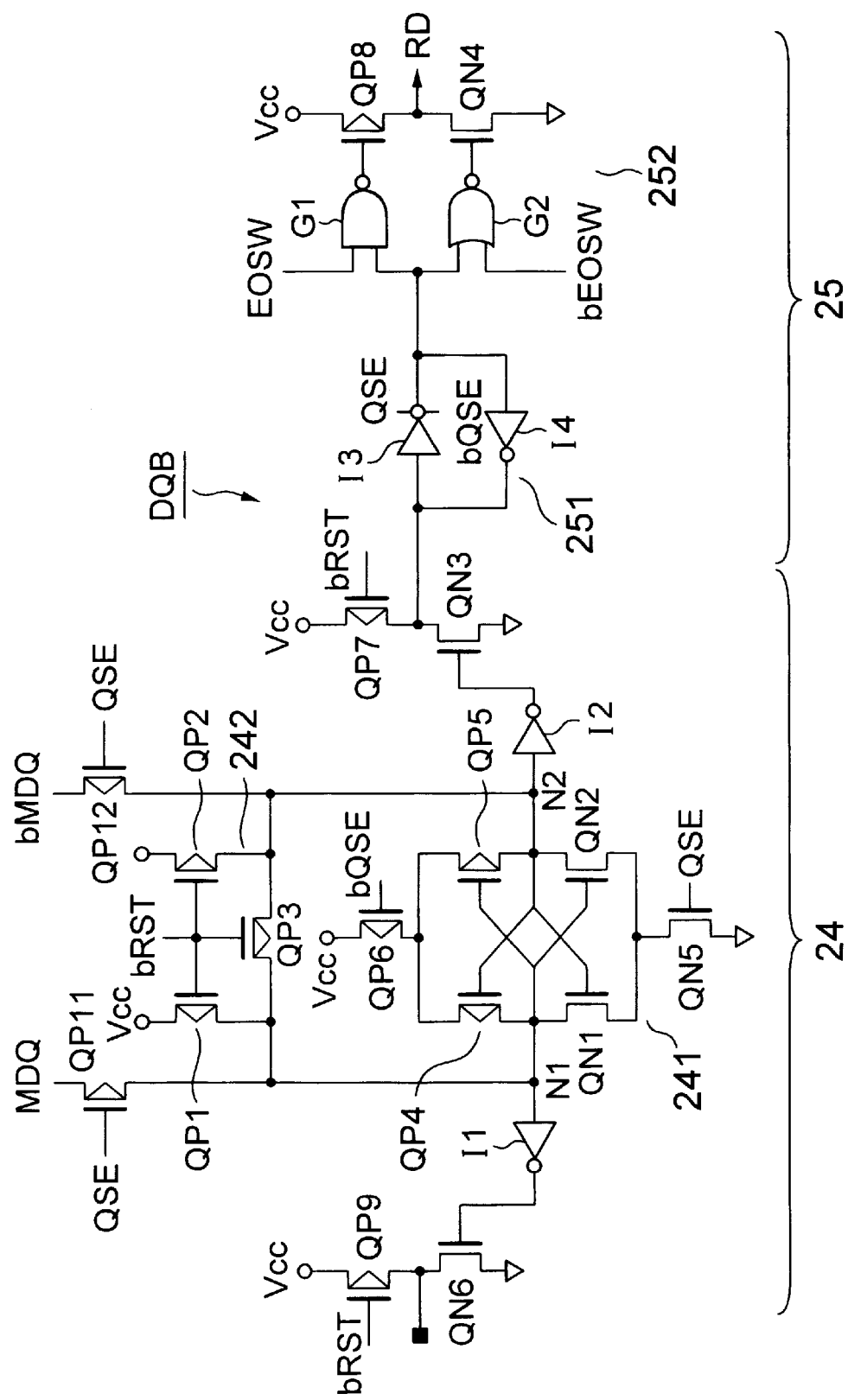
FIG. 3 is a circuit diagram showing an example of a data line buffer in FIG. 2.

FIG. 3 shows an example of one data line buffer DQB. The sense amplifier 24 has a flip-flop type sense amplifier body 241 which comprises PMOS transistors QP4, QP5 and NMOS transistors QN1, QN2. The sense amplifier body 241 has an activating PMOS transistor QP6 and an activating NMOS transistor QN5 on the side of a power supply and the ground, respectively. The activating PMOS transistor QN5 and the activating NNOS transistor QP6 are driven by complementary activating signals QSE and bQSE, respectively, which are timing-controlled by clocks. Between the main data line pair MDQ, bMDQ and sense nodes N1, N2, a transfer gate comprising PMOS transistors QP11 and QP12 is provided. This transfer gate is controlled by a sense amplifier activating signal QSE, and is turned off during the activation of the sense amplifier 241, so that the data line pair MDQ and bMDQ is separated from the sense nodes N1 and N2.

In the sense nodes N1 and N2, a data line equalizer circuit 242 comprising PMOS transistors QP1, QP2 and QP3 is provided. One sense node N1 is connected, via an inverter I1, to the gate of a dummy NMOS transistor QN6, the drain of which is connected to a pre-charging PMOS transistor QP9, which is controlled by a reset signal (pre-charge signal) bRST, to be terminated. The other sense node N2 is connected, via an inverter I2, to the gate of an output NMOS transistor QN3, the drain of which is connected to a pre-charging PMOS transistor QP7.

The latch circuit 25 has a latch circuit body 251, to which the activating signals QSE and bQSE are directly supplied as latch signals. The latch circuit body 251 comprises inverters I3 and I4, the inputs/outputs of which are cross-connected. The data of the latch circuit body 251 are transferred to a peripheral data line RD via a driver 252 which is controlled by complementary control signals EOSW and bEOSW which are in "H" or "L" in synchronism with the least significant column address CA0. The driver 252 comprises a PMOS transistor QP8 controlled by the output of a two-input NAND gate G1, to which the output of the latch circuit body 251 and the control signal EOSW are inputted, and an NMOS transistor QN4 controlled by the output of a two-input NOR gate G2, to which the output of the latch circuit body 251 and the control signal bEOSW are inputted.

That is, of the data line buffer DQB(E) and DQB(O) for sensing the 2-bit data of the main data line pairs MDQ(E), bMDQ(E) and MDQ(O), bMDQ(O), which are amplified by the sense amplifier in parallel, it is determined that the buffer DQB(E) side is A0="H", i.e., EOSW(E)="H" and bEOSW (E)="L", so that the data are head data, which are transferred to the peripheral data line RD via the driver 252. During this, in the other data line buffer DQB(O), EOSW(O)="L" and bEOSW(O)="H", so that the driver 252 remains being turned off. That is, data are held in the latch circuit body 251. Then, when A0="L", i.e., EOSW(O)="H" and bEOSW(O)= "L", the driver 252 is turned on, so that the data are transferred to the peripheral data line RD as subsequent data.

Figure 4:
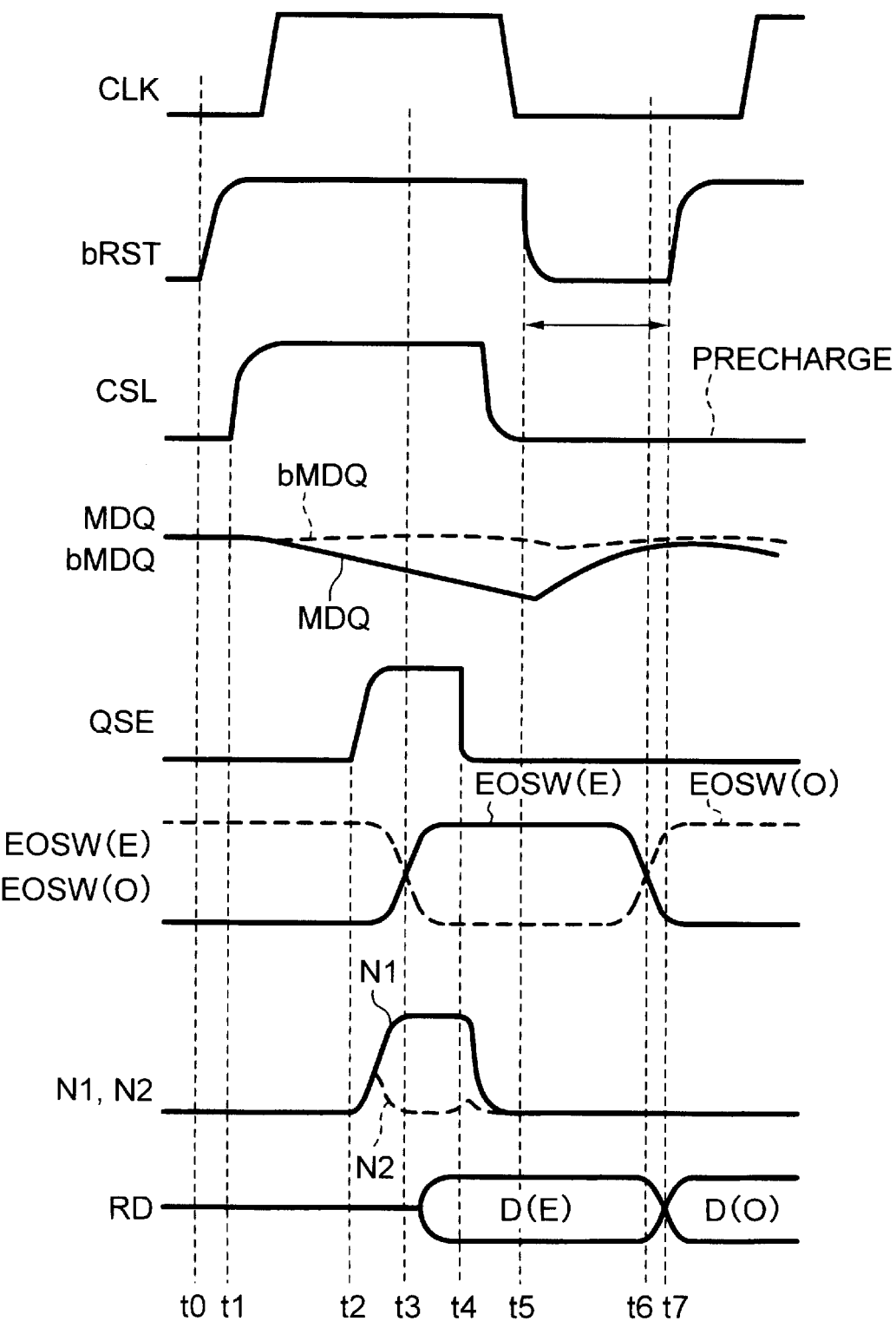
FIG. 4 is a chart showing a data transfer operation timing in the preferred embodiment.

FIG. 4 is a timing chart for a data transfer operation in this preferred embodiment. At time t0 leading the leading timing of a clock CLK, a reset signal bRST is in "H", so that the pre-charge period of the sense amplifier 24 of the data line buffer DQB expires. During the pre-charge period, the PMOS transistors QP1, QP2 and QP3 of the equalizer circuit 242 remain being turned on, so that the sense nodes N1 and N2 are pre-charged to VCC. In addition, the PMOS transistors QP7 and QP9 are turned on, so that the drain nodes of the NMOS transistors QN6 and QN3 are pre-charged to VCC.

Thereafter, a column selecting signal rises at time t1. Thus, bit line data are transferred to the main data line pair MDQ and bMDQ, so that a voltage difference occurs in accordance with the data as shown in the figure. At this time, 2-bit data per one I/O terminal are simultaneously transferred to the main data line pair as described above.

Subsequently, at time t2, an activating signal QSE of the data line sense amplifier rises, and a complementary signal bQSE thereto is in "L". Thus, in accordance with the data, one of the sense nodes N1 and N2 is changed to VCC, and the other is changed to VSS. The data of the node N2 are inverted by the inverter I2, and inverted by the NMOS transistor QN3 again to be transferred to the latch circuit body 251. The latch circuit body 251 receives the sense amplifier activating signals QSE and bQSE as latch signals to incorporate the transferred data.

Then, a control signal EOSW(E) generated in synchronism with the least significant column address CA0 rises at time t3. Thus, of the pre-fetched 2-bit data, data transferred to the latch circuit body 251 on the side of the data line pair MDQ(E) and bMDQ(E) are transferred to the peripheral data line RD via the driver 252 as head data D(E). During this, in the latch circuit 25 on the side of the other data line pair MDQ(O) and bMDQ(O), the control signal EOSW(O) is in "L" and bEOSW(O) is in "H", so that the gates G1 and G2 of the driver 252 remain being closed. Therefore, subsequent data are temporarily held in the latch circuit body 251.

After the sense nodes N1 and N2 are changed to VCC and VSS, the sense amplifier activating signal QSE is in "L" at time t4. Then, at time t5, the reset signal bRST is in "L", so that the sense amplifier 24 starts a pre-charge operation. Thereafter, in accordance with the inversion of the least significant column address CA0 at time t6, the control signal EOSW(O) is in "H" and bEOSW(O) is in "L", so that the subsequent data D(O) held in the latch circuit body 25 are transferred to the peripheral data line RD via the driver 252. Before the subsequent data are transferred to the peripheral data line RD, the head data previously transferred at the trailing edge of the clock CLK are incorporated by the FIFO buffer 26.

Thereafter, at time t7, the reset signal bSRT is in "H", and the pre-charged sense amplifier 241 is in the operation state for the next cycle.

Thus, in this preferred embodiment, in one clock cycle, the 2-bit data pre-fetched to the data line buffer are sequentially transferred to the common peripheral data line RD by the time sharing operation. The time for the subsequent data to be latched is substantially half of the clock frequency. The 2-bit data serially transferred to the peripheral data line RD in the time shearing operation are fetched from the same I/O terminal via, e.g., the FIFO buffer 26 triggered at both edges of the clock CLK, and the I/O buffer 9.

As described above, according to this preferred embodiment, of the 2-bit data per I/O terminal transferred to the data line buffer via the main data line in parallel, the head data pass through the data line buffer, and the subsequent data are temporarily held be transferred to the common peripheral data line. Therefore, the number of the peripheral data lines can be reduced to half of that in the conventional pre-fetch system. In particular, in the case of an SDRAM wherein the number of the I/O terminals is large, 16 or 32 to read 16-bit or 32-bit data in parallel, the effect of reducing the number of the peripheral data lines is great, so that it is possible to reduce the chip size.

In addition, in this preferred embodiment, the parallel-to-serial conversion is carried out by the data transfer operation from the data line buffer to the peripheral data line, so that it is not required to provide any parallel-to-serial converter circuits unlike the conventional pre-fetch system.

Moreover, in this preferred embodiment, the latch circuit 25 operates using the activating signal of the data line sense amplifier 24 as the latch signal. Therefore, while the subsequent data are held by the latch circuit 25, the sense amplifier activating signal QSE being the latch signal is in "L". In this stage, the data line sense amplifier 24 starts the pre-charge operation for the next cycle. That is, since the pre-charge operation of the data buffer and the data latch operation can temporally overlap each other, a useless clock cycle is not used by adding the latch circuit, so that it is possible to prevent the cycle time from increasing.

Figure 5:
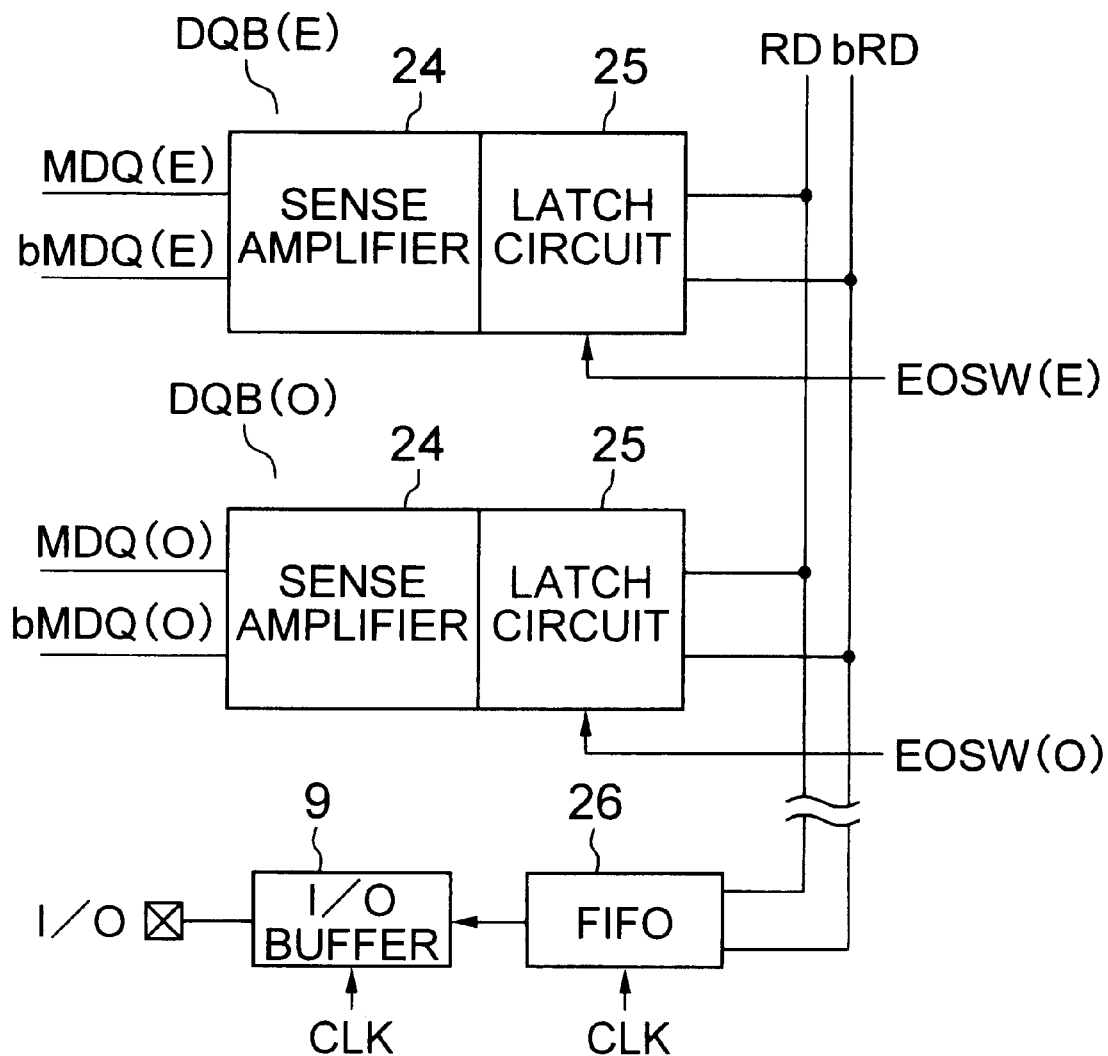
FIG. 5 is a diagram showing the construction of peripheral data lines in another preferred embodiment.

FIG. 5 shows the construction of a principal part of another preferred embodiment of an SDRAM according to the present invention, which corresponds to FIG. 2. In this preferred embodiment, the peripheral data line, to which 2-bit data are transferred in a time shearing operation, comprises complementary signal lines RD and bRD similar to the main data line. Other constructions are the same as those in the preceding preferred embodiment.

In this preferred embodiment, the number of the peripheral data lines is double as large as that in the preceding preferred embodiment. However, the number of the peripheral data lines is reduced to half of that when the pre-fetched 2-bit data are transferred to the peripheral data lines having the construction of complementary signal lines in parallel.

Figure 6:
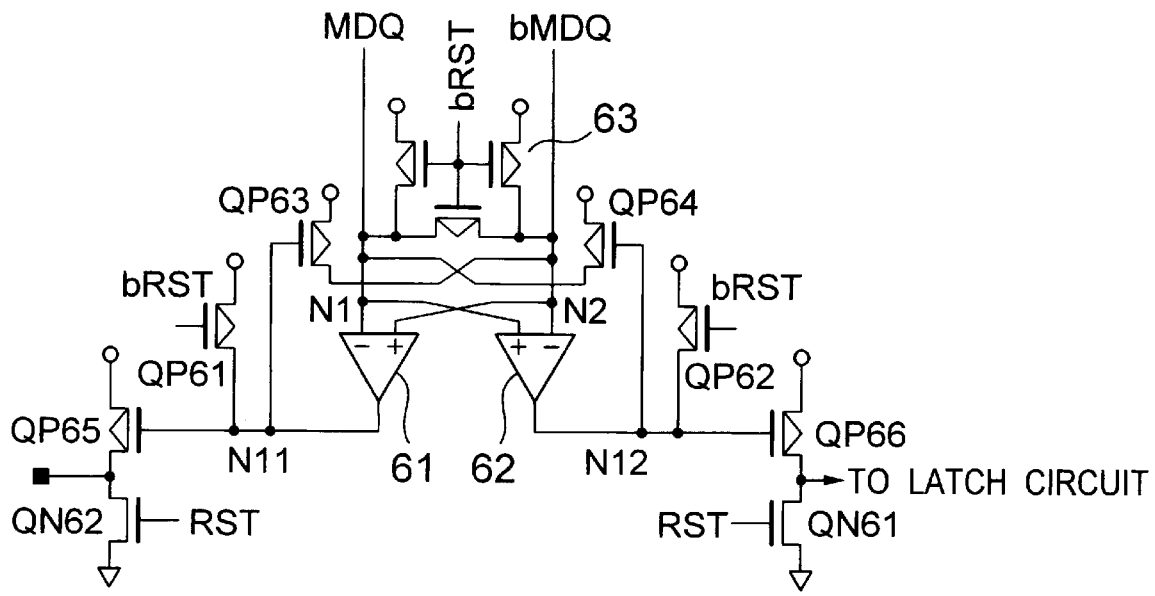
FIG. 6 is a circuit diagram of a data line sense amplifier in another preferred embodiment.

FIG. 6 is a circuit diagram of a sense amplifier circuit of a data line buffer circuit in another preferred embodiment. This data line sense amplifier mainly comprises current mirror type differential amplifiers 61 and 62. One input nodes of the differential amplifiers 61 and 62 are sense nodes N1 and N2 which are connected to main data lines MDQ and bMDQ. In each of the sense nodes N1 and N2, an equalizer circuit 63 is provided similar to the case of FIG. 3.

The output nodes N11 and N12 of the differential amplifiers 61 and 62 are connected to the gates of PMOS transistors QP63 and QP64, the drains of which are connected to the sense nodes N2 and N1, respectively. The PMOS transistors QP63 and QP64 serve to feed back the variation in potential of the output nodes N11 and N12 to the sense nodes N1 and N2 to accelerate the sense operation. PMOS transistors QP61 and QP62 connected to the output nodes N11 and N12 are provided for pre-charge. One output node N11 is terminated via an output driver comprising a PMOS transistor QP65 and an NMOS transistor QN62, and the other output node N12 is connected to a latch circuit via an output driver comprising a PMOS transistor QP66 and an NMOS transistor QN61 similar to the preceding preferred embodiment.

In this data line sense amplifier, a control signal bRST is in "L" and a control signal RST is in "H" during a pre-charge operation. Thus, the sense nodes N1 and N2 and the output nodes N11 and N12 are pre-charged to VCC. At this time, the output of the output driver is in "L". In a sense operation, when the output node N12 is in "L", the PMOS transistor QP66 of the output driver is turned on, so that an "H" level output is transmitted to the latch circuit.

In the above described preferred embodiment, while the 2-bit data per I/O terminal have been transferred to the main data lines in parallel to be transferred to the common peripheral data line in the time shearing operation, a plurality of bits of data can be generally transferred to the main data lines in parallel to be transferred to the common data line in the time shearing operation. Thus, the number of the peripheral data lines can be further decreased.

Figure 2A:
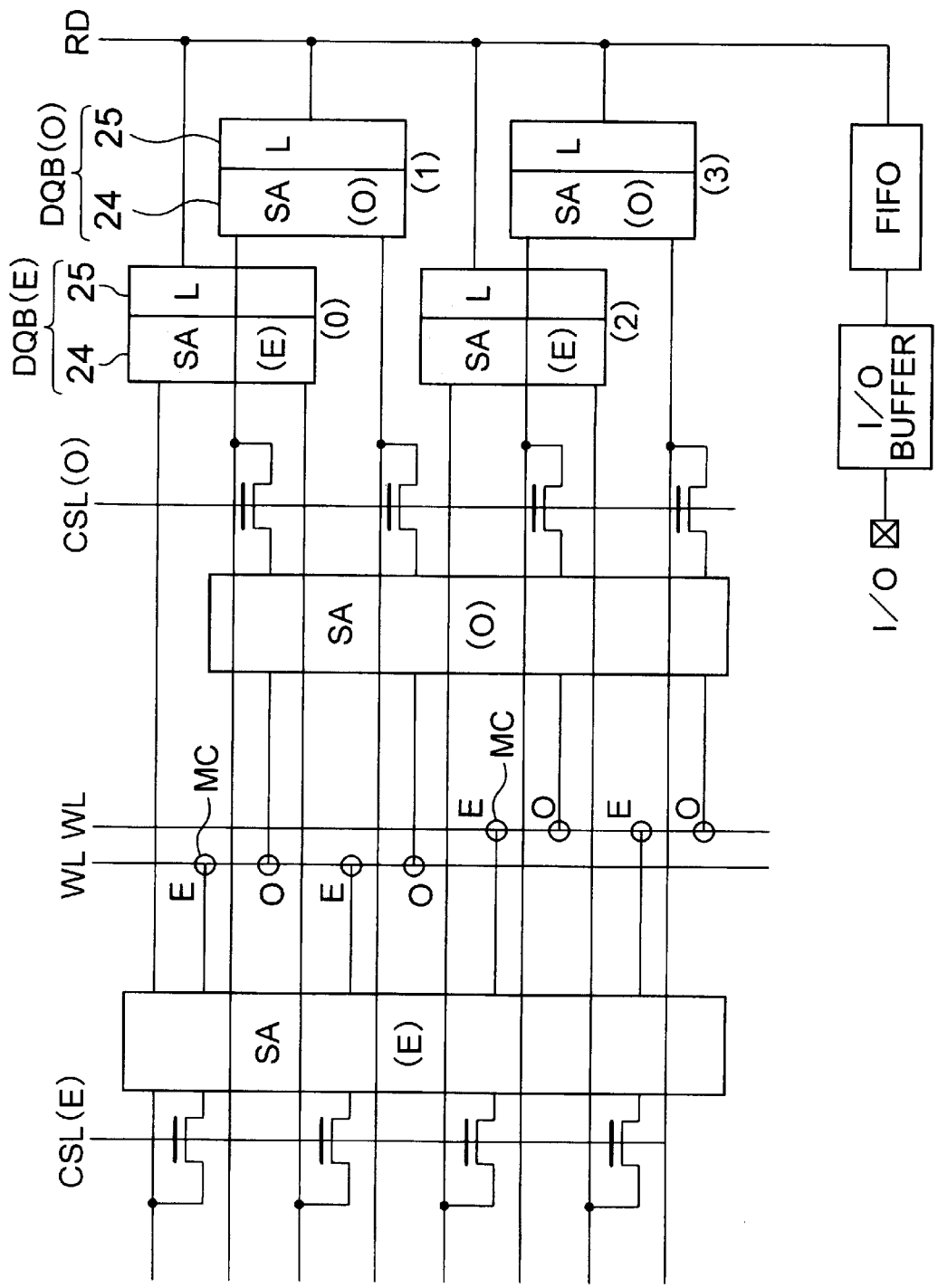

FIG. 2A shows a substantial part of an example of the above, where 4-bit data pre-fetch is performed. In this embodiment, each one bit data from each data line buffer DQB of four data line buffers DQB is transferred to a peripheral data line RD on the basis of the least significant column address CA0 and the adjacent column address CA1. According to the logic of CA0 and CA1, each data is output from each of four data line buffers as shown in the table below.

TABLE

| CASE | CA0 | CA1 | output order of DQB |
|---|---|---|---|
| 1 | 0 | 0 | (0) → (1) → (2) → (3) |
| 2 | 1 | 0 | (1) → (2) → (3) → (0) |
| 3 | 0 | 1 | (2) → (3) → (0) → (1) |
| 4 | 1 | 1 | (3) → (0) → (1) → (2) |

As known from the table, for example, in CASE 1 (CA0="0" and CA1="0"), four one-bit data are output from four data line buffers DQB to the peripheral data line RD, in order of (0)→(1)→(2)→(3). In CASEs 2–4, output operations are similar to the above. In these case, levels of CA0 and CA1 are changed in predetermined time intervals. In every predetermined time, levels of CA0 and CA1 are changed as follows: (CA0=0, CA1=0)→(CA0=1, CA1=0) →(CA0=0, CA1=1)→(CA0=1, CA1=0). In every status, each control signal is obtained, by which control signals each data line buffer outputs one-bit data in an order that (0)→(1)→(2)→(3).

In general, in the case where the number of pre-fetch data is $2^n$ (n: integer number over 1), n column address bits of the least significant bit side are used. Each data is transferred to a peripheral data line RD on the basis of a control signal obtained from the above n bits of column address.

As described above, according to the present invention, it is possible to decrease the number of peripheral data lines to reduce the chip size of an SDRAM while adopting a pre-fetch system for accelerating a data transfer cycle.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A synchronous semiconductor memory device comprising:
   a memory cell array;
   a decoder circuit for decoding an address which is supplied in synchronism with a clock, to select a memory cell of said memory cell array;
   a plurality of main data line pairs to which data of said memory cell array are transferred;
   a plurality of data line buffers each of which is provided in a corresponding one of said main data line pairs and each of which includes a latch circuit; and a plurality of peripheral data lines for transferring data of each of said data line buffers to a data input/output terminal, wherein a plurality of bits of data per data input/output terminal read out in parallel from said memory cell array, as a pre-fetch read out operation, are transferred to said data line buffers via said main data line pairs in parallel during one cycle of said clock, control signals each corresponding to each of plurality of bits of data are generated based on specific one or more bits of said address, said control signals are applied to said data line buffers, and while head data of said plurality of bits of data transfer from said latch circuits to one of said peripheral data lines, a plurality of continuous data are temporarily held in said latch circuits, and subsequent data are sequentially transferred by said control signals to the same peripheral data line as said one of said peripheral data lines, to which the head data have been transferred.

2. A synchronous semiconductor memory device as set forth in claim 1, wherein each of said data line buffers has a data line sense amplifier which is operated by an activating signal, the timing of which being controlled by said clock, and said latch circuit is connected to said data line sense amplifier to be operated by said activating signal as a latch signal.

3. A synchronous semiconductor memory device as set forth in claim 2, wherein each said latch circuit includes a latch circuit main portion being operated by said activating signal of said data line sense amplifier as said latch signal, and a driver for transferring a data stored in said latch circuit main portion to said peripheral data line, data output operation of said driver is controlled by said control signal.

4. A synchronous semiconductor memory device as set forth in claim 1, wherein each of said peripheral data lines has the construction of a single solid wire per 1-bit data, and a plurality of bits of data per one data input/output terminal are transferred to said data line buffers in parallel, said plurality of bits of data being transferred to one of said peripheral data lines in a time shearing operation.

5. A synchronous semiconductor memory device as set forth in claim 1, wherein each of said peripheral data lines has the construction of a pair of complementary signal lines per 1-bit data, and a plurality of bits of data per one data input/output terminal are transferred to said data line buffers in parallel, said plurality of bits of data being transferred to one pair of said peripheral data lines in a time shearing operation.

6. A synchronous semiconductor device as set forth in claim 1, wherein said plurality of bits of data pre-fetched are two bits, and said specific one or more bits of said address is the least significant bit.

7. A synchronous semiconductor device as set forth in claim 1, wherein said plurality of bits of data pre-fetched are four bits, and said specific one or more bits of said address are the least significant bit and the adjacent bit thereof.

8. A synchronous semiconductor device as set forth in claim 1, wherein said plurality of bits of data pre-fetched are $2^n$ (n: integer number over one) bits, and said specific one or more bits of said address are n column address bits of the least significant bit and the adjacent bit thereof.

9. A synchronous semiconductor memory device comprising:

a memory cell array including a plurality of bit lines and a plurality of word lines provided so as to intersect said plurality of bit lines, and a plurality of dynamic memory cells each of which being arranged at a corresponding one of the intersections between said plurality of word lines and said plurality of word lines;

a decoder circuit for decoding an address which is supplied in synchronism with a clock, to select one of said bit lines and one of said word lines of said memory cell array;

a plurality of main data line pairs, to which pairs a plurality of bits of data per data input/output terminals, being selected and transferred in parallel from said memory cell array by said decoder circuit;

a plurality of data line buffers each of which is provided in a corresponding one of said main data line pairs, each of said plurality of data line buffers being timing-controlled so as to sense said plurality of bits of data, which data being transferred in parallel in one cycle of said clock, to output the sensed data in a time shearing operation in serial by adding control signals to said data line buffer, each of said control signals corresponding to each of plurality of bits of data, which control signals being generated based on specific one or more bits of said address; and a plurality of peripheral data lines for serially transferring a plurality of bits of data, which are outputted in serial from said data line buffers in the time shearing operation, to a common data input/output terminal.

10. A synchronous semiconductor memory device as set forth in claim 9, wherein each of said data line buffers has a data line sense amplifier and a latch circuit, said data line sense amplifier being operated by an activating signal produced in synchronism with said clock, said latch circuit being connected to said data line sense amplifier for being operated by said activating signal as a latch signal.

11. A synchronous semiconductor memory device as set forth in claim 10, wherein each said latch circuit includes a latch circuit main portion being operated by said activating signal of said data line sense amplifier as said latch signal, and a driver for transferring a data stored in said latch circuit main portion to said peripheral data line, data output operation of said driver is controlled by said control signal.

12. A synchronous semiconductor memory device as set forth in claim 10, wherein each of said peripheral data lines has the construction of a single solid wire per 1-bit data, and a plurality of bits of data per one data input/output terminal are transferred to said data line buffers in parallel, said plurality of bits of data being transferred to one of said peripheral data lines in a time shearing operation.

13. A synchronous semiconductor memory device as set forth in claim 10, wherein each of said peripheral data lines has the construction of a pair of complementary signal lines per 1-bit data, and a plurality of bits of data per one data input/output terminal are transferred to said data line buffers in parallel, said plurality of bits of data being transferred to one pair of said peripheral data lines in a time shearing operation.

14. A synchronous semiconductor memory device comprising:

a memory core capable of pre-fetching a plurality of bits of data selected by an address;

a plurality of main data lines each of which outputs 1-bit data of said plurality of bits of data from said memory core;

a plurality of latches each of which is connected to a corresponding one of said main data lines; and a peripheral data line which is connected to an output side of each of said plurality of latches and connected to an I/O terminal, wherein said plurality of latches are arranged to sequentially output said plurality of bits of data in one cycle of clock to said peripheral data line based on specific one or more bits of said column address.

15. A synchronous semiconductor memory device as set forth in claim 14, wherein said plurality of bits of data pre-fetched are two bits, and said specific one or more bits of said column address is the least significant bit of said column address.

16. A synchronous semiconductor memory device as set forth in claim 14, wherein said plurality of bits of data pre-fetched are four bits, and said specific one or more bits are the least significant bit and the adjacent bit thereof.

17. A synchronous semiconductor memory device as set forth in claim 14, wherein plurality of bits of data pre-fetched are $2^n$ (n: integer number over one) bits, and said specific one or more bits of said address are n column address bits of the least significnat bit side.

18. A data transfer method in a synchronous semiconductor memory device, said method comprising the steps of:

giving an address to a memory core to pre-fetch a plurality of bits of data;

storing each of the pre-fetched plurality of bits of data in each of latches; and sequentially opening each of said latches by each of control signals, each of said control signals corresponding to each of specific bits of column address, to serially output 1-bit data in one cycle of clock from each of said latches to a peripheral data line.

19. A data transfer method in a synchronous semiconductor memory device as set forth in claim 18, wherein said plurality of bits of data are two bits, and said specific one or more bits of said column address is the least significant bit of said column address.

20. A data transfer method in a synchronous semiconductor memory device as set forth in claim 18, wherein said plurality of bits of data are four bits, and said specific one or more bits are the least significant bit and the adjacent bit thereof.

21. A data transfer method in a synchronous semiconductor memory device as set forth in claim 18, wherein said plurality of bits of data pre-fetched are $2^n$ (n: integer number over one) bits, and said specific one or more bits of said address are n column address bits of the least significant bit side.

* * * * *